United States Patent [19]

Sato et al.

[11] Patent Number: 5,424,590
[45] Date of Patent: Jun. 13, 1995

[54] DELAY TIME CONTROL CIRCUIT

[75] Inventors: Kenichi Sato; Moriaki Mizuno; Kouju Aoki, all of Kasugai, Japan

[73] Assignees: Fujitsu Limited, Kawasaki; Fujitsu Vlsi Limited, Kasugai, both of Japan

[21] Appl. No.: 79,799

[22] Filed: Jun. 23, 1993

[30] Foreign Application Priority Data

Jun. 25, 1992 [JP] Japan .................. 4-167879

[51] Int. Cl.6 ............... H03K 5/13; H03K 5/159; H03K 3/26
[52] U.S. Cl. ................... 327/276; 327/393; 327/564
[58] Field of Search ............. 307/303, 597, 600, 602, 307/603

[56] References Cited

U.S. PATENT DOCUMENTS

| | | | |
|---|---|---|---|
| 4,504,749 | 3/1985 | Yoshida | 307/603 |
| 4,745,310 | 5/1988 | Swapp | 307/597 |
| 5,216,301 | 6/1993 | Gleeson | 307/602 |

Primary Examiner—William L. Sikes
Assistant Examiner—Tiep H. Nguyen
Attorney, Agent, or Firm—Staas & Halsey

[57] ABSTRACT

An input signal is provided at first input terminals of a plurality of parallel AND gates in a delay time control circuit. A digital signal from a decoder having a plurality of bits is coupled to second input terminals of the AND gates with one bit coupled per AND gate. The decoder outputs a signal having an a high level in response to an external input control signal. Output signals from the AND gates are coupled to inputs of a plurality of serially connected OR gates.

9 Claims, 4 Drawing Sheets

DELAY TIME CONTROL CIRCUIT

BACKGROUND OF THE INVENTION

1. Field of the Invention

The present invention relates to a delay time control circuit for applying a delay time to input signals. More particularly, the present invention relates to a delay time control circuit, which permits the regulation of the delay time.

2. Description of the Related Art

Recently, high speed and precise operation of a semiconductor device has, in general, become well advanced. Therefore, a tester, etc. for measuring the characteristics of the semiconductor device is required to provide accurate measurement of devices with high speed operation. To realize the measurement accuracy for devices with high speed operation, out-phasing of output timing in output signals from the devices employed in the internal circuits of the tester needs to be eliminated. Therefore, as one means to solve the foregoing problem, a delay time control circuit is employed to permit the regulation of the delay time.

A conventional delay time control circuit is illustrated in FIGS. 1 and 2. A decoder 1 outputs eight bits from the associated terminals B0 through B7 in response to an externally transmitted control signal. Each of the eight bits, B0 through B7, are coupled to each of the first input terminals of AND gates 2a through 2h, respectively. In response to the control signal, the decoder 1 outputs a "1" state signal (i.e., high level signal, hereinafter referred to as H level signal) from any one of the associated terminals B0 through B7 of the digital signal, and a "0" state signal (i.e., low level signal, hereinafter referred to as L level signal) from the other remaining seven terminals. An input signal SGin is coupled to an input of OR gate 3a. An output signal from the OR gate 3a is coupled to a second input terminal of the AND gate 2a and an input of OR gate 3b.

An output signal from the OR gate 3b is coupled to a second input terminal of the AND gate 2b and an input of OR gate 3c. An output signal from the OR gate 3c is coupled to a second input terminal of the AND gate 2c and an input of OR gate 3d. An output signal from the OR gate 3d is coupled to a second input terminal of the AND gate 2d and an input of OR gate 3e. An output signal from the OR gate 3e is coupled to a second input terminal of the AND gate 2e and an input of OR gate 3f. An output signal from the OR gate 3f is coupled to a second input terminal of the AND gate 2f and an input of OR gate 3g. An output signal from the OR gate 3g is coupled to a second input terminal of the AND gate 2g and an input of OR gate 3h. An output signal from the OR gate 3h is coupled to a second input terminal of the AND gate 2h. Output signals from the AND gates 2a through 2h are coupled, respectively, to an 8-input OR gate 4, so that the 8-input OR gate 4 outputs an output signal SGout.

As an example, in the delay time control circuit having the above-described circuit configuration, when the input signal SGin is input to the OR gate 3a while only one bit, B0, is in the H level, the input signal SGin is transmitted through the OR gate 3a, the AND gate 2a, and the 8-input OR gate 4 as the output signal SGout. Further, when the input signal SGin is input with only one bit, B2, in the H level, the input signal SGin is transmitted as the output signal SGout, through the OR gates 3a, 3b and 3c, the AND gate 2c, and the 8-input OR gate 4. Therefore, since the number of stages of the OR gates 3a through 3h through which the input signal SGin passes can be controlled, the delay time of the output signal SGout with respect to the corresponding input signal SGin can be selected, depending on which one bit of the digital signal is in the H level.

One example of a cell layout on a semiconductor substrate for the delay time control circuit is shown in FIG. 2. A first cell array 5 comprises the OR gates 3a through 3h and the AND gates 2a through 2h. A second cell array 6 includes the 8-input OR gate 4 and the decoder 1. The input signal SGin is coupled to an input terminal Ti of the OR gate 3a. Output terminals To of the OR gates 3a through 3g are connected to input terminals Ti of the OR gates 3b through 3h disposed at the successive stage and first input terminals Ti of the AND gates 2a through 2g, by conducting lines La through Lg, respectively.

The output terminal To of the OR gate 3h is connected to the first input terminal Ti of the AND gate 2h by the conducting line Lh. The second input terminals Ti of the AND gates 2a through 2h are connected to outputs B0–B7 of the decoder 1, respectively, by conducting lines Li. The output terminals To of the AND gates 2a through 2h are connected, respectively, to the input terminals of the 8-input OR gate 4, by conducting lines Lo.

In this configuration, in order to accurately regulate the delay time of output signal SGout according to the digital signal output by the decoder 1 at the terminals B0 through B7 and then propagated through respective AND gates 2a through 2h, the delay time for a single stage of the OR gates 3a through 3h should be regulated and matched to one another.

However, the output signal from each of the OR gates 3a through 3g is coupled from its single output terminal To to each of the AND gates 2a through 2g and to each of the OR gates 3b through 3h disposed at the successive stage by conducting lines, La through Lg, which are branched away at their midpoints. The output signal from the OR gate 3h is coupled only to AND gate 2h by a conducting line Lh, which is not branched away. Therefore, the length of the conducting line connected to the OR gate 3h differs from those for the OR gates 3a through 3g, with the lengths of the conducting lines connected to the output terminals of the OR gates 3a through 3g being greater. Therefore, the design of the circuit layout becomes considerably difficult in order to align the delay times. For example, in the first cell array 5 as shown in FIG. 2, the lengths of the conducting lines La through Lh are inventively arranged to be equal in length by mingling the AND gates 2a through 2h with the OR gates 3a through 3h, respectively, in order to align the delay time caused by the respective conducting lines of the OR gates 3a through 3h.

As a result, the lengths of the conducting lines La through Lh are equalized to the longest length. Therefore, as the lengths of the conducting lines are increased, capacitance of the conducting lines is increased, resulting in jitter generated in the output signals.

Further, as the lengths of the conducting lines La through Lh are increased, the number of the conducting lines disposed between each one of the cell arrays 5 and 6 is increased. Therefore, when the cell layout in the bulk stage is altered during the manufacturing of a cell array, for example, spacing between adjacent conducting lines will be reduced, because the area shared for conducting lines is kept fixed. Cross-talk can then occur between the closely disposed conducting lines.

On the other hand, an input signal SGin is transmitted as a respective output signal SGout by propagation through at least one stage of the OR gates 3a through 3h, the corresponding stage of the AND gates 2a through 2h, and the 8-input OR gate 4. Therefore, a shorter delay time than that caused by the above-described three stages cannot be selected, and a delay time control circuit to accurately calibrate the delay time cannot be designed.

As the number of elements for the circuit of the 8-input OR gate 4 disposed at the last stage increases, the operation speed is substantially reduced. In order to equalize the lengths of the conducting lines, the lengths of the conducting lines connecting the AND gates 2a through 2h and the 8-input OR gate 4 is standardized to the longest length thereof. Therefore, a high frequency input signal SGin cannot be efficiently followed, and characterization of a high frequency signal is rather inadequate.

SUMMARY OF THE INVENTION

A primary object of the present invention is to provide a delay time control circuit, which simplifies the circuit layout, improves characterization of a high frequency signal while reducing jitter generation in output signals, and permits the accurate regulation of the delay time.

To achieve the foregoing objects, an input signal is coupled to a plurality of first input terminals of AND gates in parallel. Each of a plurality of bits output from a decoder is coupled to each of the second input terminals of the AND gates, respectively. The decoder outputs a digital signal having an H level in response to an externally input control signal. Each of the output signals from the AND gates is respectively coupled to an input of each of a plurality of serially connected OR gates.

BRIEF DESCRIPTION OF THE DRAWINGS

The features of the present invention that are believed to be novel are set forth with particularity in the appended claims. The invention, together with the objects and advantages thereof, may best be understood by reference to the following description of the presently preferred embodiments together with the accompanying drawings, in which:

DESCRIPTION OF THE PREFERRED EMBODIMENTS

First Embodiment

Figure 1:
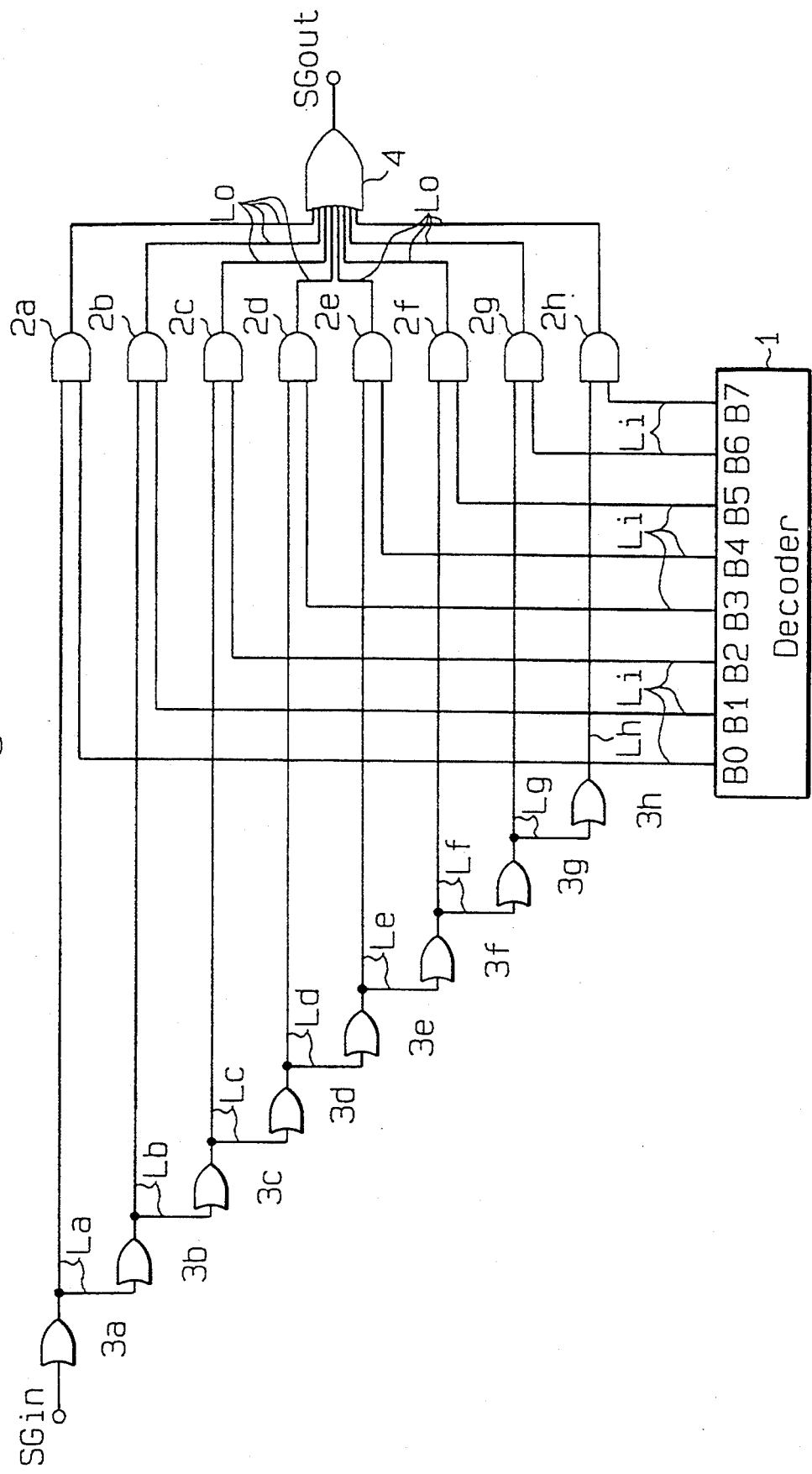
FIG. 1 is a circuit diagram showing a conventional delay time control circuit.
Figure 2:
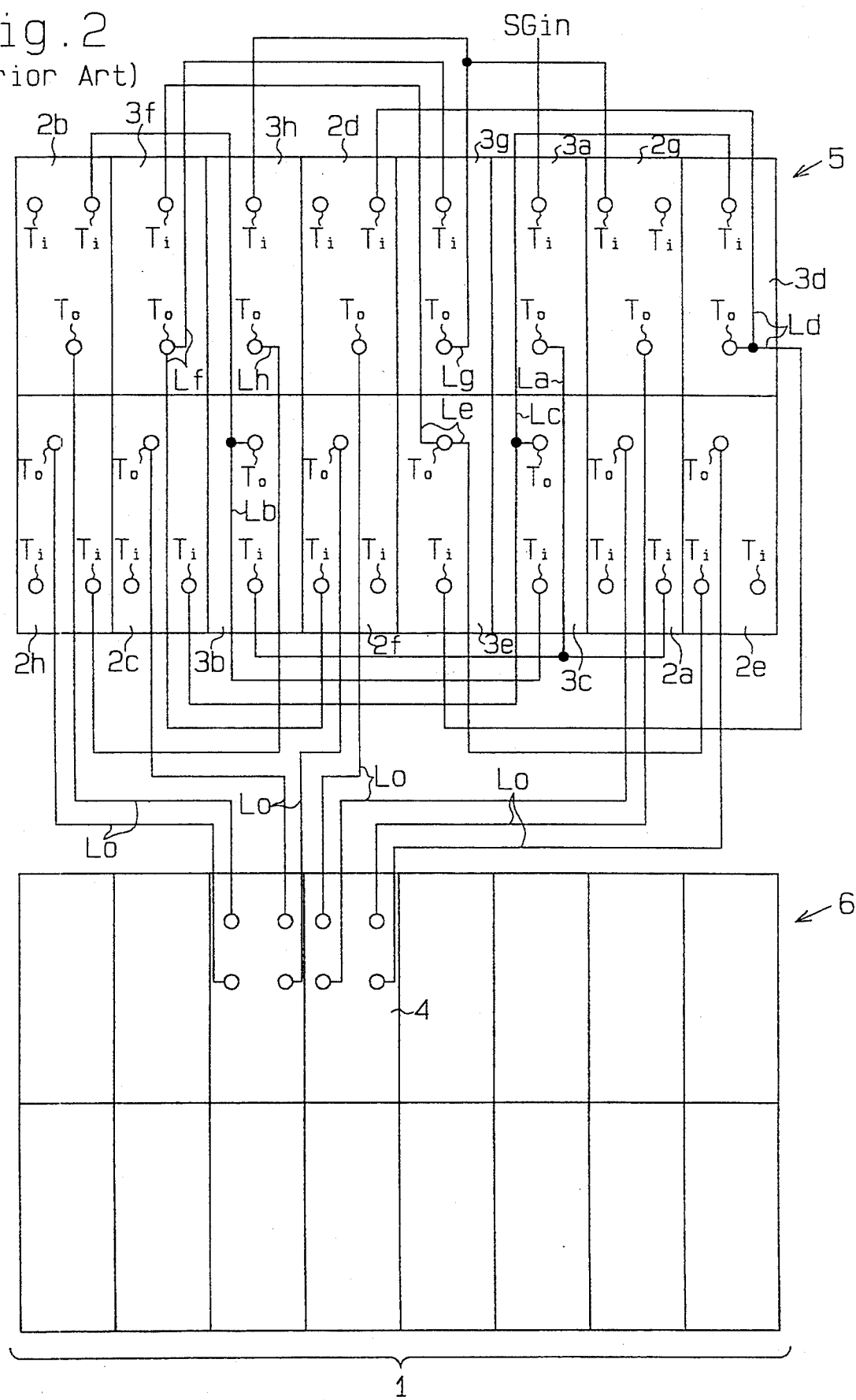
FIG. 2 is a layout diagram showing the conventional delay time control circuit.
Figure 3:
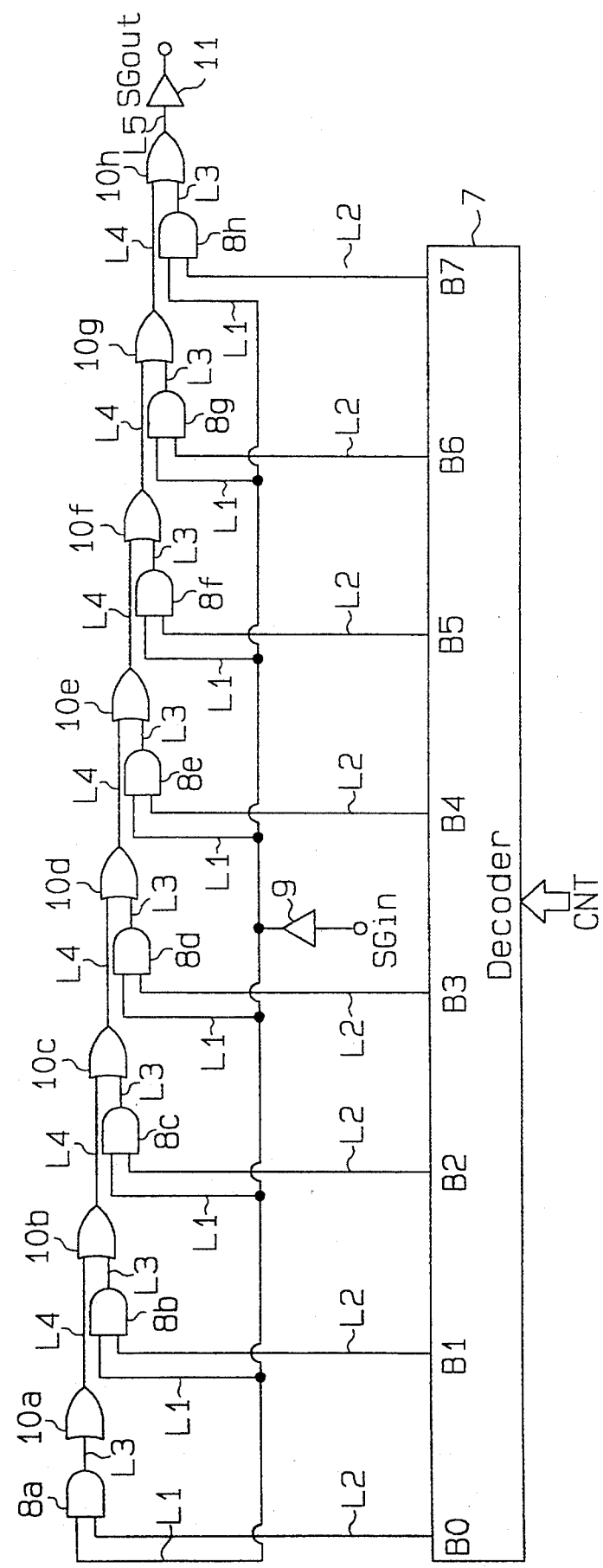
FIG. 3 is a circuit diagram of a delay time control circuit of an embodiment according to the present invention.

A preferred embodiment according to the present invention is described with reference to FIGS. 3 and 4.

A decoder 7 outputs eight bits at the corresponding terminals B0 through B7 in response to an externally transmitted control signal, CNT. Bits B0–B7 are respectively coupled to second input terminals of AND gates 8a through 8h.

In response to the control signal, the decoder 7 outputs a "1" state signal (i.e., high level signal, hereinafter referred to as an H level signal) from any one of the corresponding terminals B0 through B7, and a "0" state signal (i.e., low level signal, hereinafter referred to as an L level signal) from the remaining seven other terminals.

An input signal SGin is coupled through an input buffer circuit 9 to first input terminals of the parallel AND gates 8a through 8h, respectively,. An output signal from the AND gate 8a is coupled to an input of OR gate 10a. An output signal from the OR gate 10a is coupled to a first input terminal of an OR gate 10b. An output signal from the AND gate 8b is coupled to a second input terminal of the OR gate 10b. An output signal from the OR gate 10b is coupled to a first input terminal of an OR gate 10c.

An output signal from the AND gate 8c is coupled to a second input terminal of the OR gate 10c. An output signal from the OR gate 10c is coupled to a first input terminal of an OR gate 10d. An output signal from the AND 8d is coupled to a second input terminal of the OR gate 10d. An output signal from the OR gate 10d is coupled to a first input terminal of an OR gate 10e. An output signal from the AND gate 8e is coupled to a second input terminal of the OR gate 10e. An output signal from the OR gate 10e is coupled to a first input terminal of an OR gate 10f. An output signal from the AND gate 8f is coupled to a second input terminal of the OR gate 10f. An output signal from the OR gate 10f is coupled to a first input terminal of an OR gate 10g.

An output signal from the AND gate 8g is coupled to a second input terminal of the OR gate 10g. An output signal from the OR gate 10g is coupled to a first input terminal of an OR gate 10h. An output signal from the AND gate 8h is coupled to a second input terminal of the OR gate 10h. An output signal from the OR gate 10h is transmitted as an output signal SGout through an output buffer circuit 11.

Figure 4:
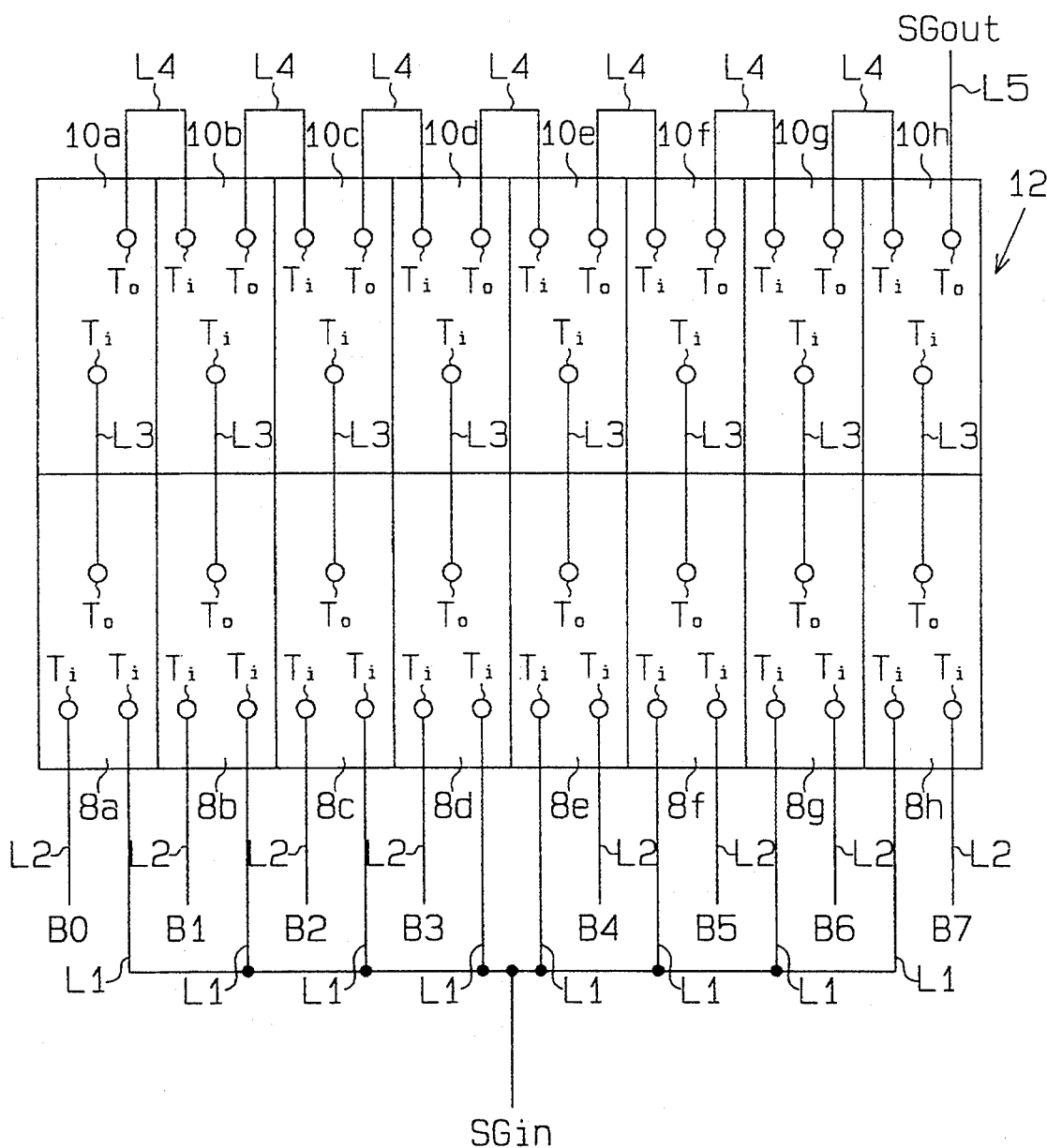
FIG. 4 is a layout diagram showing the delay time control circuit in FIG. 3.

A preferred example of a cell layout on a semiconductor substrate for a delay time control circuit which is designed with the above-described configuration is illustrated in FIG. 4. A cell array 12 includes eight basic cells which form the OR gates 10a through 10h, respectively, and eight basic cells which form the AND gates 8a through 8h, respectively. The OR gates 10a through 10h and the AND gates 8a through 8h are disposed in rows with the respective AND gate and OR gate to be paired up (e.g., an AND gate 8a and an OR gate 10a) adjacently disposed.

First input terminals Ti of the AND gate 8a through 8h are connected to an input buffer circuit 9 by conducting lines L1, respectively. The input buffer circuit 9 is provided at another cell array (not shown). Second input terminals Ti of the AND gates 8a through 8h are connected to the decoder 7 by conducting lines L2, respectively. Output terminals To of the AND gates 8a through 8h are respectively connected to the associated input terminals Ti of the OR gates 10a through 10h by equal length conducting lines L3. Output terminals To of the OR gates 10a through 10g are respectively connected to the associated input terminals Ti of the OR gates 10b through 10h disposed at the successive stage by equal length conducting lines L4. An output terminal To of the OR gate 10h is connected to a buffer circuit 11 by a conducting line L5. The buffer circuit 11 is disposed at another cell array other than cell array 12.

As an example of the delay time control circuit, when an input signal SGin is input to the AND gate 8a through the input buffer circuit 9, and only bit B0 is at an H level, the input signal SGin is transmitted as the respective output signal SGout, via the AND gate 8a, OR gates 10a through 10h, and output buffer circuit 11. Similarly, when the input signal SGin is input with bit B3 at an H level, the input signal SGin is transmitted as the output signal SGout, via the AND gate 8d, OR gates 10d through 10h, and output buffer circuit 11.

In the delay time control circuit, the number of the OR gates 10a through 10h through which the input signal SGin will pass, is regulated by selectively changing the levels of the bits B0 through B7. The input signal SGin is transmitted as the respective output signal SGout, via one of the AND gates 8a through 8h, a selected number of the OR gates, and output buffer circuit 11. Therefore, delay time of the output signal SGout with respect to the input signal SGin will be regulated according to its propagation through the selected number of the OR gates 10a through 10h. The output terminals To of the OR gates 10a through 10g are respectively connected to the successively disposed OR gates 10b through 10h by equal length conducting lines L4. The output terminal To of the OR gate 10h is connected to the input of output buffer circuit 11.

As each one of the OR gates 10a through 10h is connected in series, it becomes easier to design a circuit layout which results in the lengths of the conducting lines being shortened and equally lengthened by arranging the OR gates 10a through 10h in a row. The conducting lines L3, which transmit the output signals from the AND gates 8a through 8h, are connected only to the associated OR gates 10a through 10h, respectively. Therefore, by arranging the AND gates 8a through 8h in a row, it becomes easier to design a circuit layout which results in the lengths of the conducting lines L3 being shortened and equally lengthened. Since the AND gates 8a through 8h are arranged in a row, it becomes easier to design a circuit layout which results in the lengths of the respective conducting lines L1 that transmit an input signal SGin to the AND gates 8a through 8h to be shortened and equally lengthened.

Therefore, the delay time for a single stage of the OR gates 10a through 10h becomes easier to align. Jitter generation in an output signal SGout caused by the capacitance of the conducting lines, can be reduced. Since the lengths of the conducting lines can be shortened, spacing between the adjacent conducting lines can be sufficiently provided. As a result, cross-talk between the adjacent conducting lines can be significantly reduced. Further, since multi-input OR gates are not employed at the last stage, the high frequency characteristic can be efficiently improved. An input signal SGin is transmitted as the respective output SGout, via a single stage of the AND gate, at least one stage of the OR gates, and the output buffer circuit 11. Since the buffer circuit 11 operates at a significantly higher speed than that of the conventional 8-input OR gate, shorter delay time can be selected compared to that of the prior art. Further, accurate and fine delay time control can be performed.

Although only one embodiment of the present invention has been described herein, it should be apparent to those skilled in the art that the present invention may be embodied in many other specific forms without departing from the spirit or scope of the invention. For example, the delay time control circuit according to the present invention has an eight stage configuration including eight OR gates and eight AND gates. However, the number of the stages is not limited to eight, and can be altered to a suitable number.

Therefore, the present examples and embodiments are to be considered as illustrative and not restrictive, and the invention is not to be limited to the details given herein, but may be modified within the scope of the appended claims.

What is claimed is:

1. A delay time control circuit comprising:
   a plurality of AND gates having first and second input terminals, respectively, with the first input terminals thereof receiving an input signal to be delayed;
   a decoder outputting a digital signal having a plurality of bits, coupled to the second input terminals of the AND gates, said decoder outputting a high level signal in any one bit of the digital signal in response to an external input control signal; and
   a plurality of OR gates connected in series, with each of said OR gates receiving an output signal from a respective one of said AND gates.

2. The delay time control circuit according to claim 1, wherein the OR gates are provided in a row on a semiconductor substrate.

3. The delay time control circuit according to claim 1, wherein the AND gates are provided in a row on a semiconductor substrate.

4. The delay time control circuit according to claim 1, wherein the OR gates and AND gates are provided in rows, one of the OR gates and one of the AND gates that are to be mutually connected are adjacently disposed.

5. The delay time control circuit according to claim 1, wherein said plurality of OR gates and AND gates are provided in rows, and one of said plurality of OR gates and one of said plurality of AND gates that are to be mutually connected are adjacently disposed on a semiconductor substrate.

6. A delay time control circuit comprising:
   a plurality of AND gates having first and second input terminals, respectively, with the first input terminals thereof receiving an input signal to be delayed;
   a decoder outputting a digital signal having a plurality of bits, coupled to the second input terminals of the AND gates, said decoder outputting a high level signal in any one bit of the digital signal in response to an external input control signal; and
   a plurality of OR gates connected in series, with each of said OR gates receiving an output signal from a respective one of said AND gates, wherein:
   said OR gates are provided in a row on a semiconductor substrate; and
   lengths of conducting lines connecting pairs of adjacently disposed OR gates are equal.

7. A delay time control circuit comprising:
   a plurality of AND gates having first and second input terminals, respectively, with the first input terminals thereof receiving an input signal to be delayed;
   a decoder outputting a digital signal having a plurality of bits, coupled to the second input terminals of the AND gates, said decoder outputting a high level signal in any one bit of the digital signal in response to an external input control signal; and a plurality of OR gates connected in series, with each of said OR gates receiving an output signal from a respective one of said AND gates, wherein:

said plurality of OR gates and AND gates are provided in rows;

one of said plurality of OR gates and one of said plurality of AND gates that are to be mutually connected are adjacently disposed; and lengths of conducting lines connecting the OR gates with the AND gates, respectively, are equal.

8. A delay time control circuit comprising:

a plurality of AND gates provided in a row on a semiconductor substrate and having first and second input terminals, with the first input terminals thereof receiving an input signal to be delayed;

a decoder outputting a digital signal having a plurality of bits, the digital signal being coupled to the second input terminals of said AND gates by every bit thereof, and said decoder outputting a high level signal in any one bit of the digital signal in response to an external input control signal;

a plurality of OR gates connected in series to one another, and disposed in a row on a semiconductor substrate, and each of said OR gates receiving an output signal from a respective one of said AND gates;

first conducting lines being equal in length, for connecting adjacently disposed OR gates, wherein:

said OR gates and said AND gates are mutually connected and adjacently disposed on the semiconductor substrate; and second conducting lines, being equal in length, connect said OR gates with said AND gates, respectively.

9. A delay time control circuit comprising:

a decoder for outputting a digital signal comprising a plurality of bits, said decoder outputting a high level signal for any of said plurality of bits of the digital signal, in response to an external input control signal;

a plurality of AND gates having first and second input terminals, respectively, the first input terminal receiving an input signal to be delayed, and the second input terminal coupled to said decoder, each respective second input terminal receiving one of said plurality of bits of the digital signal from said decoder, each of said plurality of AND gates outputting an output signal; and a plurality of OR gates connected in series, with each of said OR gates receiving one of said output signals from a respective one of said AND gates.

* * * * *